United States Patent
Mizuno et al.

(10) Patent No.: US 10,117,368 B2
(45) Date of Patent: Oct. 30, 2018

(54) BOARD WORK DEVICE

(71) Applicant: FUJI CORPORATION, Chiryu (JP)

(72) Inventors: Takayuki Mizuno, Okazaki (JP);
Hidetoshi Kawai, Chiryu (JP);
Hidetoshi Ito, Okazaki (JP); Masahiro Kondo, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 203 days.

(21) Appl. No.: 14/912,206

(22) PCT Filed: Sep. 4, 2013

(86) PCT No.: PCT/JP2013/073769
§ 371 (c)(1),
(2) Date: Feb. 16, 2016

(87) PCT Pub. No.: WO2015/033399
PCT Pub. Date: Mar. 12, 2015

(65) Prior Publication Data
US 2016/0205818 A1   Jul. 14, 2016

(51) Int. Cl.
*H05K 13/04* (2006.01)
*H05K 13/00* (2006.01)

(52) U.S. Cl.
CPC ......... *H05K 13/0069* (2013.01); *H05K 13/04* (2013.01); *H05K 13/0404* (2013.01)

(58) Field of Classification Search
CPC ............... H05K 13/0015; H05K 13/04; H05K 13/0404; H05K 3/30; H05K 3/301; H05K 13/0069
See application file for complete search history.

(56) References Cited

U.S. PATENT DOCUMENTS

| | | | | |
|---|---|---|---|---|
| 4,392,301 A | * | 7/1983 | Hannes | H05K 13/0491 29/741 |
| 4,461,073 A | * | 7/1984 | Harringer | H05K 13/0491 29/741 |
| 4,615,110 A | * | 10/1986 | Crone | H05K 13/0491 29/741 |
| 4,616,414 A | * | 10/1986 | Cushman | B25J 15/0253 29/741 |

FOREIGN PATENT DOCUMENTS

CN    1977577 A    6/2007
CN   102577660 A    7/2012
(Continued)

OTHER PUBLICATIONS

Japanese Office Action dated Jul. 4, 2017 in Japanese Patent Application No. 2015-535199 (with English translation).
(Continued)

*Primary Examiner* — Carl Arbes
(74) *Attorney, Agent, or Firm* — Oblon, McClelland, Maier & Neustadt, L.L.P.

(57) ABSTRACT

A board work device provided with mounting head that performs work with respect to a circuit board, slider on which the mounting head is mounted, moving device that moves the slider to any position, and support pin gripping device for gripping support pins which is provided on the slider on the opposite side to the side on which the mounting head is mounted.

6 Claims, 10 Drawing Sheets

(56) References Cited

FOREIGN PATENT DOCUMENTS

| DE | 10 2008 023 614 B3 | 11/2009 |
|---|---|---|
| JP | 2007-287986 A | 11/2007 |
| JP | 2011-9585 A | 1/2011 |
| WO | 2005/081611 A1 | 9/2005 |
| WO | 2005/107354 A1 | 11/2005 |
| WO | 2011/046107 A1 | 4/2011 |
| WO | WO 2011/046107 A1 | 4/2011 |

OTHER PUBLICATIONS

Extended Search Report dated Aug. 19, 2016 in European Patent Application No. 13892861.9.
International Search Report dated Nov. 19, 2013 in PCT/JP13/073769 Filed Sep. 4, 2013.
Combined Chinese Office Action and Search Report dated Feb. 11, 2018 in corresponding Patent Application No. 201380079306.4 (with English Translation and English Translation of Category of Cited Documents) citing documents AO and AP therein, 15 pages.
Office Action dated Jan. 30, 2018 in Japanese Patent Application No. 2015-535199 (with English language translation).
Office Action dated May 16, 2018 in Chinese Patent Application No. 201380079306.4 with English translation.
Chinese Office Action issued in Chinese Patent Application No. 201380079306.4 dated Aug. 6, 2018 (w/ English Translation).

\* cited by examiner

BOARD WORK DEVICE

TECHNICAL FIELD

The present disclosure relates to a board work device provided with a work head for performing work with respect to a circuit board, a mounting member on which the work head is mounted, and a movement device for moving the mounting member to any position.

BACKGROUND ART

Conventionally, when performing work with respect to a circuit board using a board work device, the circuit board is supported and fixed from below using multiple support pins or the like. To appropriately fix the circuit board, it is desirable to change the layout position of the multiple support pins based on the shape of the circuit board. Thus, there are board work devices provided with a support pin gripping device for gripping a support pin, wherein the layout position of board pins is changed by the support pin gripping device. With the board work device disclosed in the patent literature below, a support pin gripper device is integrated into the work head. The work head is usually capable of being moved to any position on the base of board work device by a moving device or the like. Thus, the support pin gripper device can also move to any position on the base of the board work device, and it is possible to suitably change the set position of the support pins.

Patent literature 1: WO2005/081611

BRIEF SUMMARY

Technical Problem

According to the board work device disclosed in the above patent literature, it is possible to suitably change the set position of support pins. However, often work heads are detachably attached to a mounting member of a moving device, such that exchange and so on of work heads is possible. In other words, for example, in a case in which a mounting head is mounted on the mounting member, the mounting head can be removed from the mounting member, and a dispenser head can be mounted on the mounting member instead of the mounting head. Thus, instead of performing work of mounting electronic components onto a circuit board, it is possible to perform application work of a viscous fluid onto the circuit board. However, in a case in which the support pin gripping device is integrated into the mounting head, exchanging to a dispenser head device that it is no longer possible to change the set position of support pins. Also, for example, if a support pin gripping device is integrated not only into the mounting head, but also into the dispenser head, equipment costs increase. The present disclosure takes account of these issues, and an object thereof is to provide a board work device that allows the set position of support pins to be changed even when exchanging work heads, and while curtailing increases in equipment costs.

Solution to Problem

To solve the above problem, one embodiment of a board work device comprises: a work head that performs work with respect to a circuit board; a mounting member on which the work head is mounted; a moving device that moves the mounting member to any position; and a support pin gripping device that grips a support pin, which supports a circuit board, in order to attach the support pin to a pin support member; wherein the support pin gripping device is mounted on a side of the mounting member opposite to the side of the mounting member on which the work head is mounted.

The board work device according to an aspect of the disclosure, wherein the support pin gripping device includes multiple gripping members with a protrusion section formed on an end thereof; and a holding body that holds the multiple gripping members such that the protruding sections of the respective gripping members are moved closer to each other or further apart from each other; and wherein the support pin gripping device grips the support pin by the protruding sections of the multiple gripping members moving closer to each other, and, instead of the support pin, grips a member which is different from the support pin, in which is formed a recess into which the protruding section can fit, by the protruding sections of the multiple gripping members moving closer to each other and the protruding section fitting into the recess.

Further, the board work device according to an aspect of the disclosure, wherein the support pin gripping device includes a contacting member provided on the holding body that contacts the member which is different from the support pin when the protruding section is fitted into the recess.

Further, the board work device according to an aspect of the disclosure, wherein the contacting member does not contact the support pin which is gripped by the support pin gripping device.

Further, the board work device according to an aspect of the disclosure, wherein the support pin gripping device is detachably mounted on the mounting member.

Effects

With the board work device of this embodiment, the support pin gripping device is mounted on a surface of the mounting member on the opposite side to the surface of the mounting member to which the work head is mounted. Thus, the support pin gripping device is continuously mounted on the mounting member even when work heads are exchanged, so there is no need to integrate a support pin gripping device into each work head. This curtails increases in equipment costs while allowing the arrangement position of support pins to be changed when work heads are exchanged.

Further, with the board work device of this embodiment, the support pin gripping device grips not only support pins, but a member which is different from a support pin in which a recess is formed. This allows the support pin gripping device to perform a wide variety of work, thereby improving practicality.

Further, with the board work device of this embodiment, a contacting member is provided on the holding body, and the contacting member contacts the member, which is different from a support pin, which is gripped by the support pin gripping device. Because the support pin gripping device is designed for appropriately gripping a support pin, when the support pin gripping device grips a member which is different from a support pin, there is a concern that the member may wobble. However, with the board work device of this embodiment, the contacting section contacts the member, which is different from a support pin, which is gripped by the support pin gripping device. Thus, it is possible to curtail the wobbling of the member, which is different from a support pin, which is gripped by the support pin gripping device.

Further, with the board work device of this embodiment, the contacting member does not contact the support pin which is gripped by the support pin gripping device. Because the support pin gripping device is designed for appropriately gripping a support pin, when the support pin gripping device grips a support pin, there is no concern about the support pin wobbling. Thus, by preventing unnecessary contact with the support pin for which there is no concern with regard to wobbling, it is possible to appropriately grip the support pin by the support pin gripping device.

Further, with the board work device of this embodiment, the support pin gripping device is detachably mounted on the mounting member. By this, for example, it is possible to mount a device with different functionality to the support pin gripping device on the mounting member, thus allowing a greater variety of work to be performed by the board work device.

DETAILED DESCRIPTION

The following describes in detail referring to the figures an example embodiment of the present disclosure.
<Board Work Device Configuration>

Figure 1:
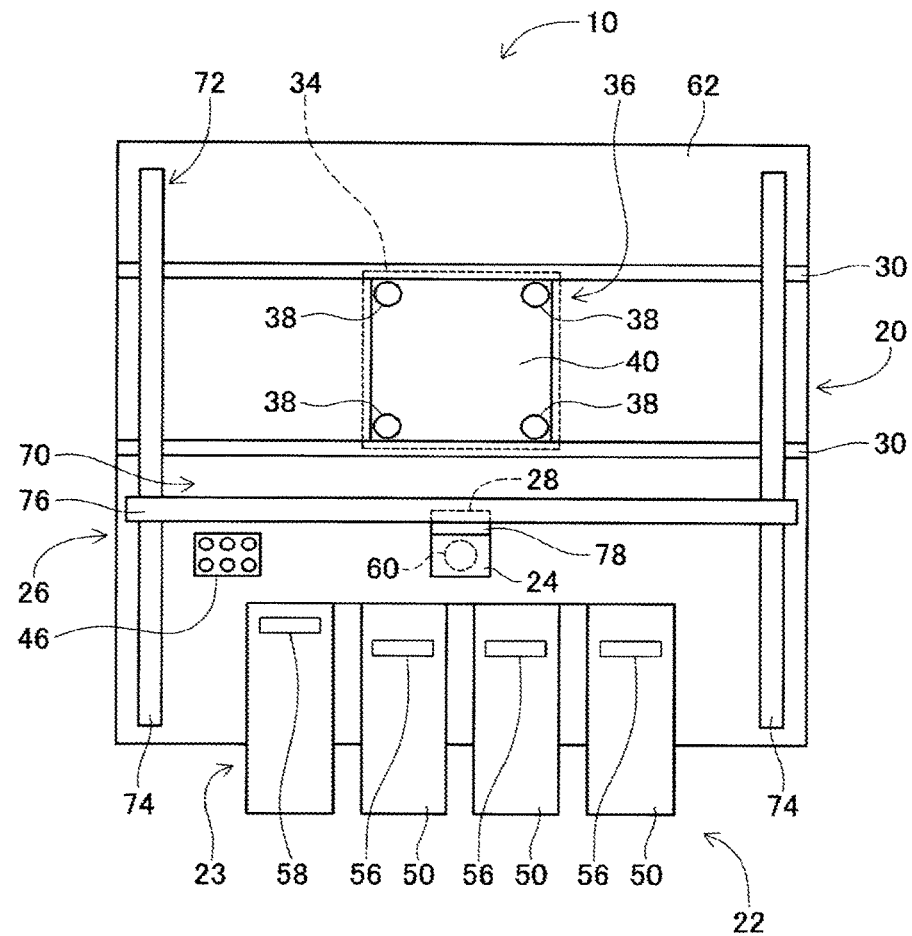
FIG. 1 shows a board work machine which is an embodiment of the present disclosure.
Figure 1:
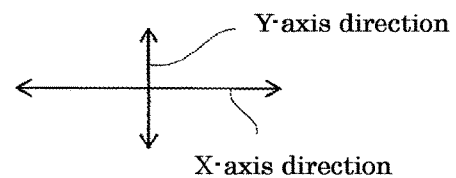

FIG. 1 shows board work device 10 that is an embodiment of the present disclosure. Board work device 10 is a device for performing mounting work of electronic components onto a circuit board. Board work device 10 is provided with conveyance device 20, supply device 22, case supply device 23, mounting head 24, mounting head moving device (hereinafter sometimes referred to as "moving device") 26, and support pin gripping device 28.

Conveyance device 20 has a pair of conveyor belts 30 extending in the X-axis direction and an electromagnetic motor (not shown) for turning the conveyor belts 30. Circuit board 34 is supported by this pair of conveyor belts 30 and is conveyed in the X-axis direction by the driving of the electromagnetic motor. Also, conveyance device 20 has board holding device 36 which fixedly holds circuit board 34 supported by conveyor belts 30 at a predetermined position. Specifically, board holding device 36 has multiple support pins 38 and pin supporting member 40. Pin supporting member 40 is a flat plate formed from magnetic material and is provided between the pair of conveyor belts 30. On the other hand, a magnet (not shown) is provided on the bottom surface of support pins 38. Thus, support pins 38 are fixed on the upper surface of pin supporting member 40 by magnetic force. Also, each support pin 38 is movable in the vertical direction, and by the movement upwards of support pins 38, circuit board 34 is raised. Also, edge sections of raised circuit board 34 contact a retaining section (not shown), and by being sandwiched between the retaining section and support pins 38, circuit board 34 is fixedly held in the predetermined position.

Figure 2:
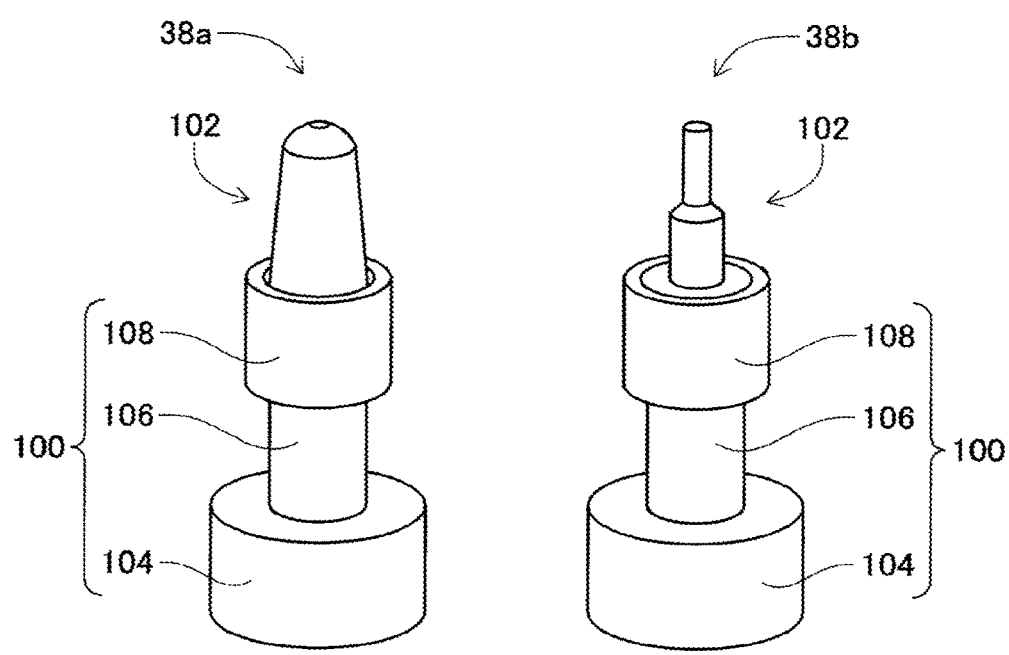
FIG. 2 is a perspective diagram showing support pins.

Note that, as given above, because support pins 38 are fixed to pin supporting member 40 by magnetic force, they are detachable from pin supporting member 40. Thus, support pins 38 are fixed to any position on pin supporting member 40 based on the shape and so on of circuit board 34. Also, as shown in FIG. 2, for support pins 38, there is soft support pin 38a with a tip section formed from a soft material, and hard support pin 38b with a tip section formed from a hard material. Usually, hard support pins 38b are used when supporting circuit board 34. However, when it is difficult to support circuit board 34 using hard support pins 38b due to the location of pre-mounted components which are close to each other and so on, soft support pins 38a are used. That is, the arrangement position of support pins 38 is changed based on the shape and so on of circuit board 34, and use of soft support pins 38a and hard support pins 38b is switched based on the pitch between pre-mounted components. Note that, in order to allow the changing of the arrangement position of support pins 38, and the switching between soft support pins 38a and hard support pins 38b, support pin storage device 46 for storing support pins 38 is provided next to conveyance device 20.

Multiple feeders (not shown) for supplying tape components and bulk feeders 50 are set on component supply device 22. Bulk feeder 50 of the present embodiment is configured from component case (refer to FIG. 7) 52, and a supply passage (not shown). Multiple electronic components are stored in a loose state in component case 52, and the electronic components stored in component case 52 are arranged in a single line in the supply passage. Further, the electronic components arranged in a single line are guided to a supply position so as to be supplied to the supply position. Note that, component case 52 is exchangeable so as to allow component replenishment, component exchange, and so on. In detail, case transfer window 56 is formed in the upper surface of bulk feeder 50, and a component case 52 which has become unnecessary in bulk feeder 50 are ejected from case transfer window 56. Also, a required component case 52 is inserted from case transfer window 56. By this, for example, by ejecting a component case 52 which has become empty from case transfer window 56 and inserting a component case 52 full of electronic components from case transfer window, bulk feeder 50 is replenished with electronic components.

Case supply device 23 is a device for supplying component cases 52 and is provided next to bulk feeder 50. Multiple component cases 52 are stored in case supply device 23, and any case out of the multiple component cases 52 can be ejected from case transfer window 58. Also, by inserting component case 52 via case transfer window 58, that component case 52 is stored inside case supply device 23.

Mounting head 24 mounts electronic components on a circuit board. In detail, mounting head 24 has suction nozzle 60 provided on a lower end thereof. Suction nozzle 60 is connected to a positive/negative pressure supply device (not shown) via a negative pressure air and positive pressure air passage. Suction nozzle 60 picks up and holds an electronic component using negative pressure, and releases the held electronic component using positive pressure. Also, mounting head 24 has a raising/lowering device (not shown) that raises/lowers suction nozzle 60. Mounting head 24 changes the vertical position of a held electronic component by the raising/lowering device.

Moving device 26 moves mounting head 24 to any position on base 62. In detail, moving device 26 is configured from X-axis direction slide mechanism 70 and Y-axis direction slide mechanism 72. Y-axis direction slide mechanism 72 has a pair of Y-axis direction guide rails 74, and that pair of Y-axis direction guide rails 74 is provided extending in the Y-axis direction. On the other hand, X-axis direction slide mechanism 70 has X-axis direction guide rail 76, and that X-axis direction guide rail 76 extends in the X-axis direction on the pair of Y-axis direction guide rails 74. Y-axis direction slide mechanism 72 has an electromagnetic motor (not shown), and X-axis direction guide rail 76 is moved to any position in the Y-axis direction by the driving of the electromagnetic motor. X-axis direction guide rail 76 holds slider 78 as to be movable along its own axis. X-axis direction slide mechanism 70 has electromagnetic motor (not shown), and slider 78 is moved to any position in the X-axis direction by the driving of the electromagnetic motor. Mounting head 24 is mounted on slider 78. According to such a structure, mounting head 24 is moved to any position on base 62 by moving device 26. Note that, mounting head 24 is attachable/detachable to/from slider 78 with a single touch. By this, it is possible to change to different types of work heads such as a dispenser head.

Figure 3:
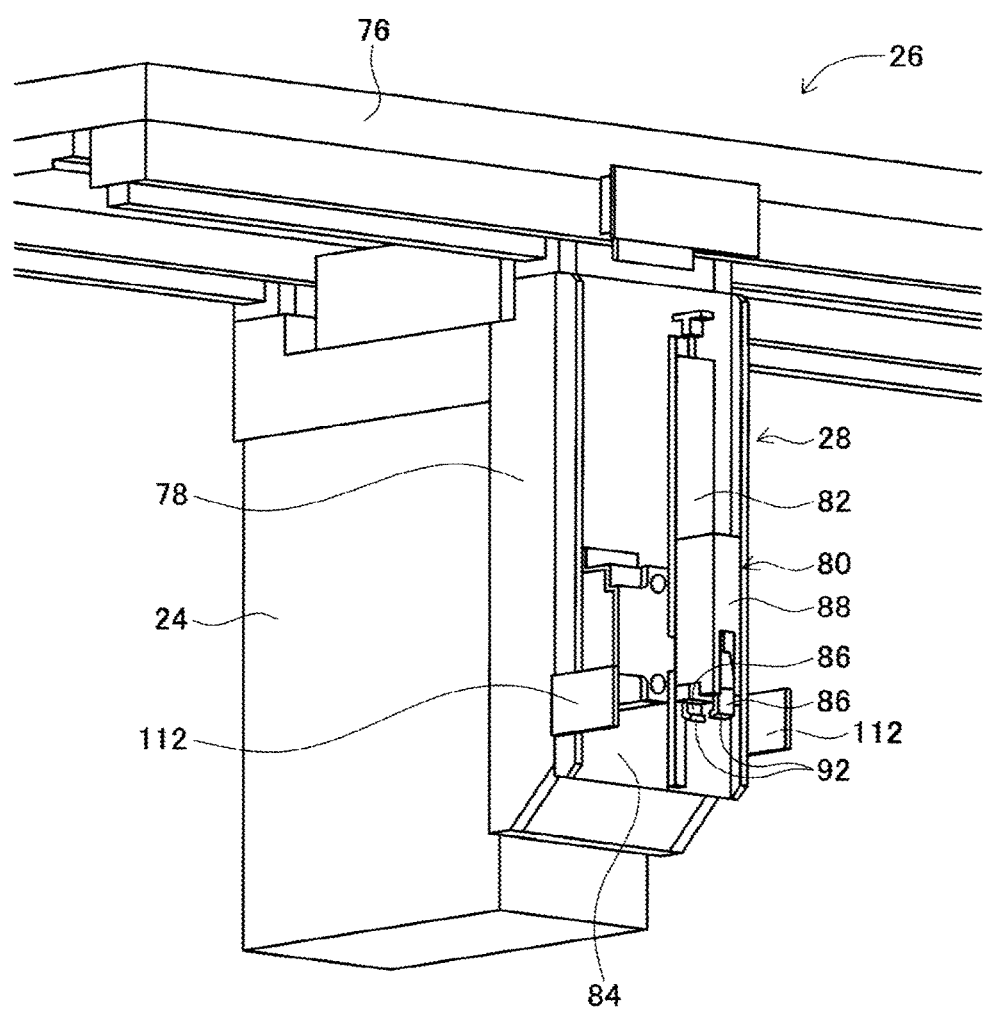
FIG. 3 is a perspective diagram showing a mounting head and support pin gripping device mounted on a slider.

Support pin gripping device 28 is a device for gripping a support pin 38. As shown in FIG. 3, support pin gripping device 28 is provided on the side of slider 78 opposite to the side of slider 78 on which mounting head 24 is mounted, and has holding tool 80, slide mechanism 82, and main body 84. Holding tool 80 is configured from a pair of gripping claws 86 and holding body 88. Protruding section 92 is formed on the tip of the pair of gripping claws 86, and the protruding sections 92 face each other. Holding body 88 holds the pair of gripping claws 86 such that protruding sections 92 move towards each other or apart from each other. Also, depending on elastic force, protruding sections 92 of the pair of gripping claws 86 move closer to each other, thus holding tool 80 grips support pin 38. Also, depending on positive pressure from the positive/negative pressure supply device, protruding sections 92 of the pair of gripping claws 86 move apart from each other, thus holding tool 80 releases support pin 38.

In detail, as shown in FIG. 2, soft support pin 38a and hard support pin 38b are configured from main body 100 and tip section 102. The shape of tip section 102 differs between soft support pin 38a and hard support pin 38b, but the shape of main body 100 is the same for soft support pin 38a and hard support pin 38b. Main body 100 is a stepped cylinder configured from first outer section 104, second outer section 106, and third outer section 108. First outer section 104 is positioned at the base of main body 100. Second outer section 106 is positioned on the upper surface of first outer section 104, and the diameter of second outer section 106 is smaller than the diameter of first outer section 104. Third outer section 108 is positioned on the upper surface of second outer section 106, and the diameter of third outer section 108 is larger than the diameter of second outer section 106.

Figure 4:
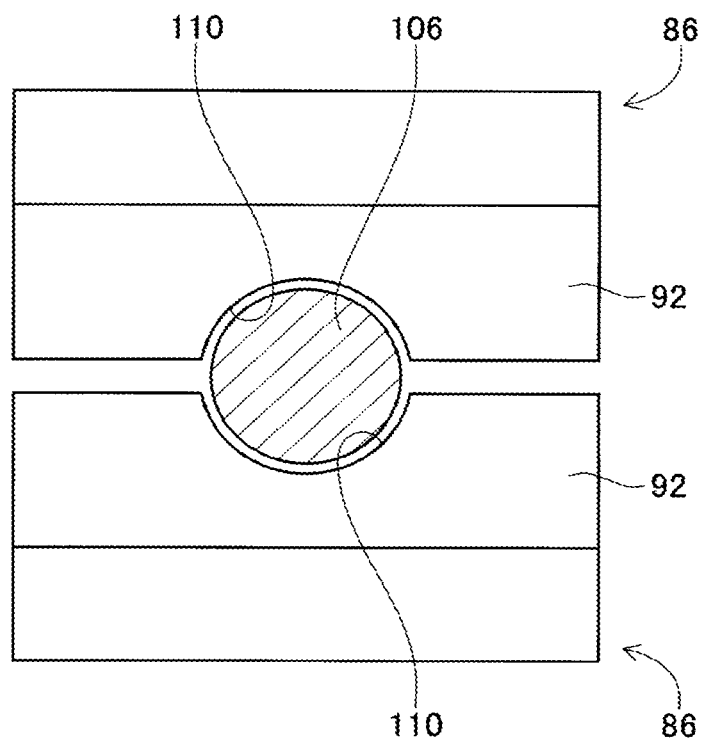
FIG. 4 is a cross-section diagram showing a support pin being gripped by the gripping claws of the support pin gripping device.
Figure 5:
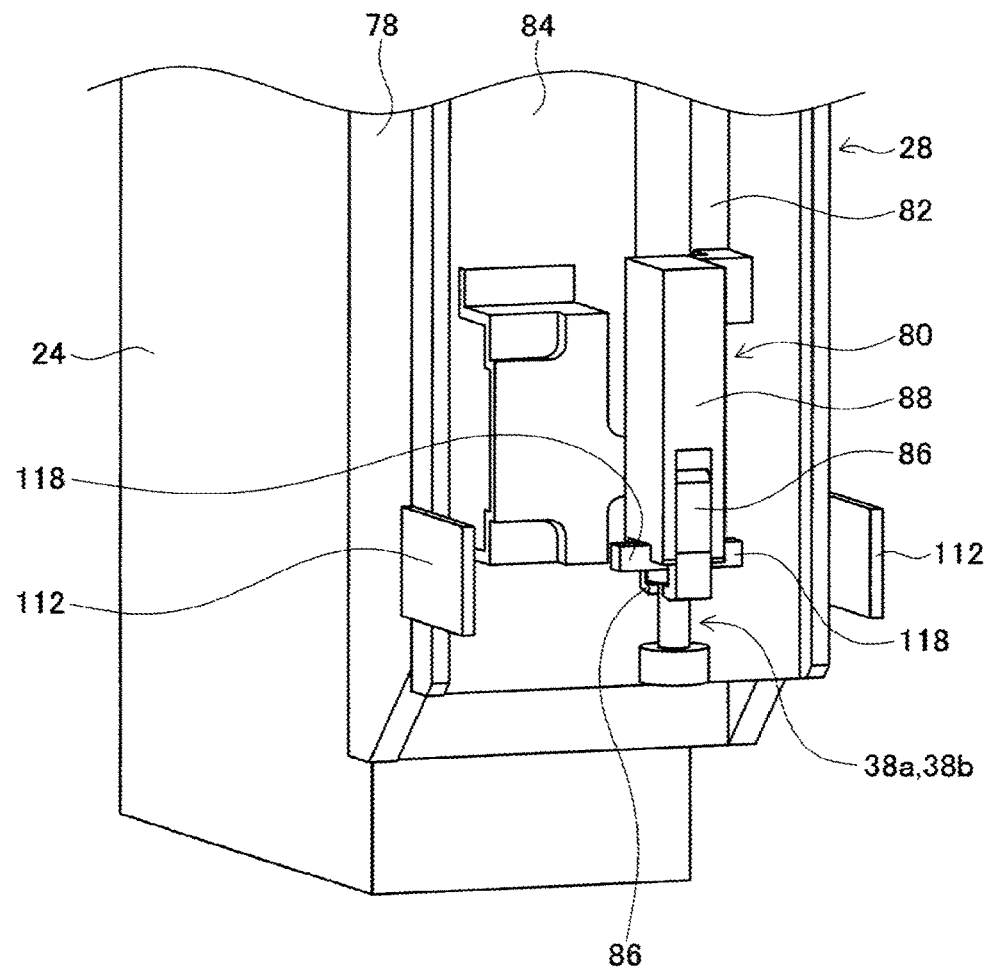
FIG. 5 is a perspective diagram showing the support pin gripping device gripping a support pin.

On the other hand, as shown in FIG. 4, semi-circular cutout 110 is formed in protruding section 92 of gripping claw 86, and the internal diameter of that semi-circular cutout 110 is slightly larger than the external diameter of second outer section 106. Also, protruding sections 92 of the pair of gripping claws 86 move closer to each other depending on the elastic force of a coil spring (not shown). Accordingly, as shown in FIG. 5, by protruding sections 92 of the pair of gripping claws 86 moving closer to each other such that second outer section 106 is sandwiched between cutouts 110, soft support pin 38a or hard support pin 38b is gripped by holding tool 80. Also, protruding sections 92 of the pair of gripping claws 86 move apart from each other against the elastic force of the coil spring depending on positive pressure from the negative/positive pressure supply device. By this, a held soft support pin 38a or hard support pin 38b is released from holding tool 80.

Also, slide mechanism 82 holds holding tool 80 so as to be slidable in a vertical direction, and holding tool 80 slides up and down by an electromagnetic motor (not shown) being driven. By this, support pin gripping device 28 changes the vertical position of a soft support pin 38a or a hard support pin 38b held by holding tool 80. Note that, check sensor 112 is provided on a side surface of holding tool 80, and using the sensor it is judged whether or not holding tool 80 is appropriately gripping soft support pin 38a or hard support pin 38b.

Figure 6:
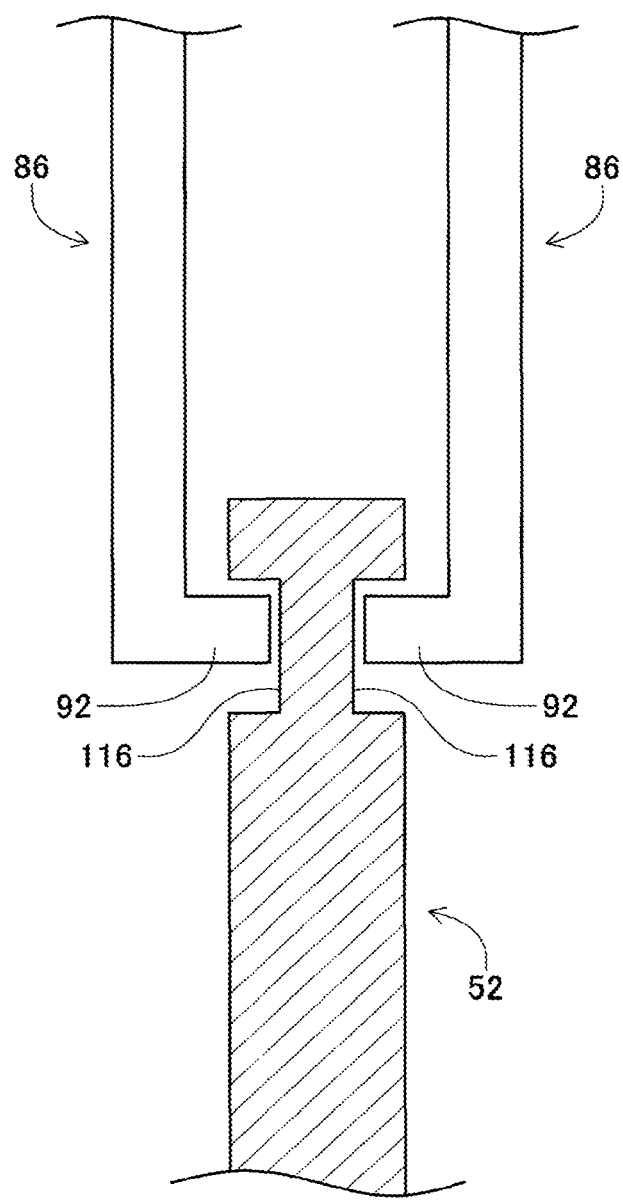
FIG. 6 is a cross-section diagram showing a component case being gripped by the gripping claws of the support pin gripping device.
Figure 7:
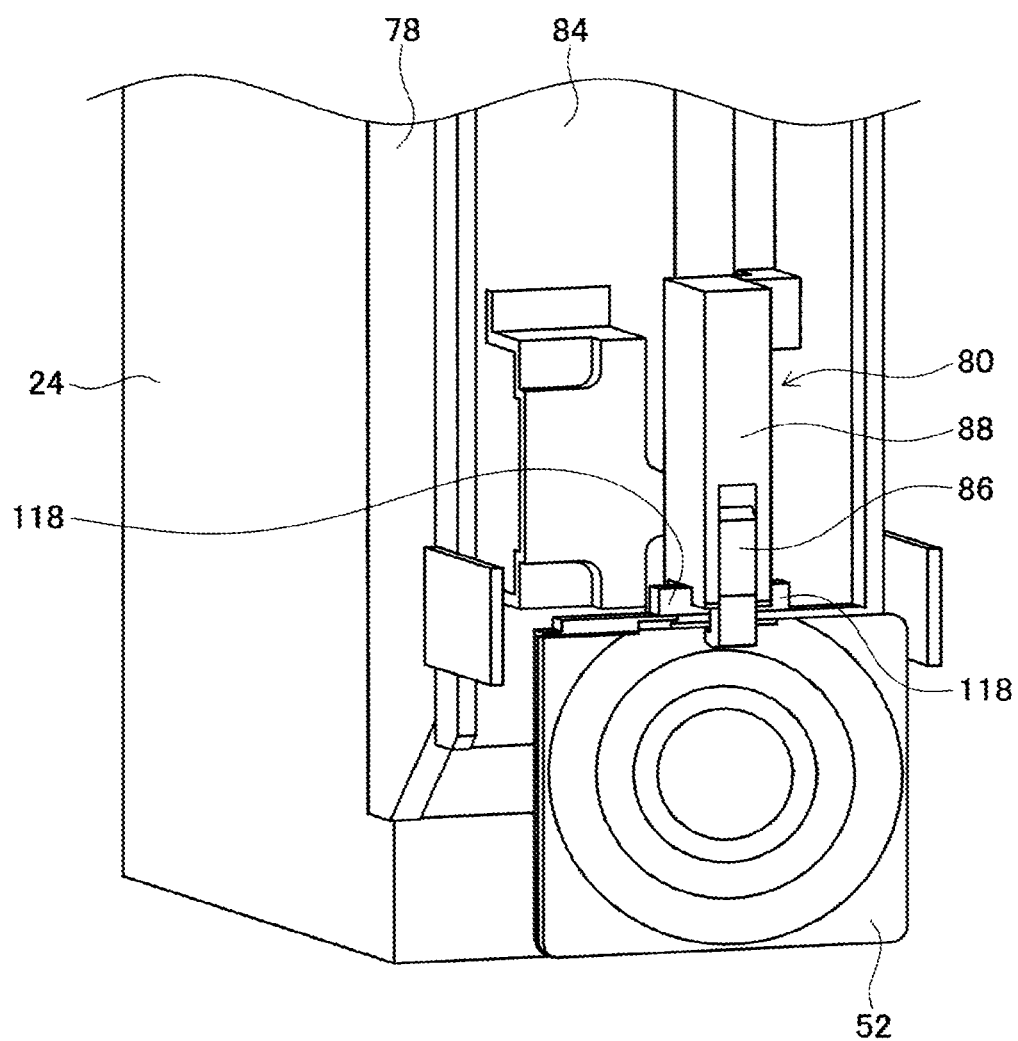
FIG. 7 is a perspective diagram showing the support pin gripping device gripping a component case.

Also, holding tool 80 is capable of gripping not only soft support pin 38a and hard support pin 38b, but also of gripping component case 52 of bulk feeder 50. In detail, as shown in FIG. 6, recess 116 is formed in both sides on the upper edge section of component case 52. Recess 116 is a shape such that protruding section 92 of the pair of gripping claws 86 of holding tool 80 is capable of engaging with recess 116, and protruding sections 92 enter recesses 116 by protruding sections 92 moving closer to each other. By this, as shown in FIG. 7, component case 52 is gripped by holding tool 80. In this way, holding tool 80 is capable of gripping not only support pin 38, but also component case 52.

Note that, a pair of contacting members 118 is attached to holding body 88 of holding tool 80, and shifting of component case 52 held by holding tool 80 is prevented by this pair of contacting members 118. In detail, the pair of contacting members 118 is attached to a lower end of holding body 88 so as to sandwich the movement region of the pair of gripping claws 86. The pair of contacting members 118 contact an upper edge of component case 52 when component case 52 is gripped by holding tool 80. By this, shifting of component case 52 held by holding tool 80 is prevented. Note that, as shown in FIG. 5, contacting members 118 do not contact soft support pin 38a or hard support pin 38b held by holding tool 80. This is because soft support pin 38a and hard support pin 38b are reliably sandwiched due to cutouts 110, so there is no need to prevent shifting.

Figure 8:
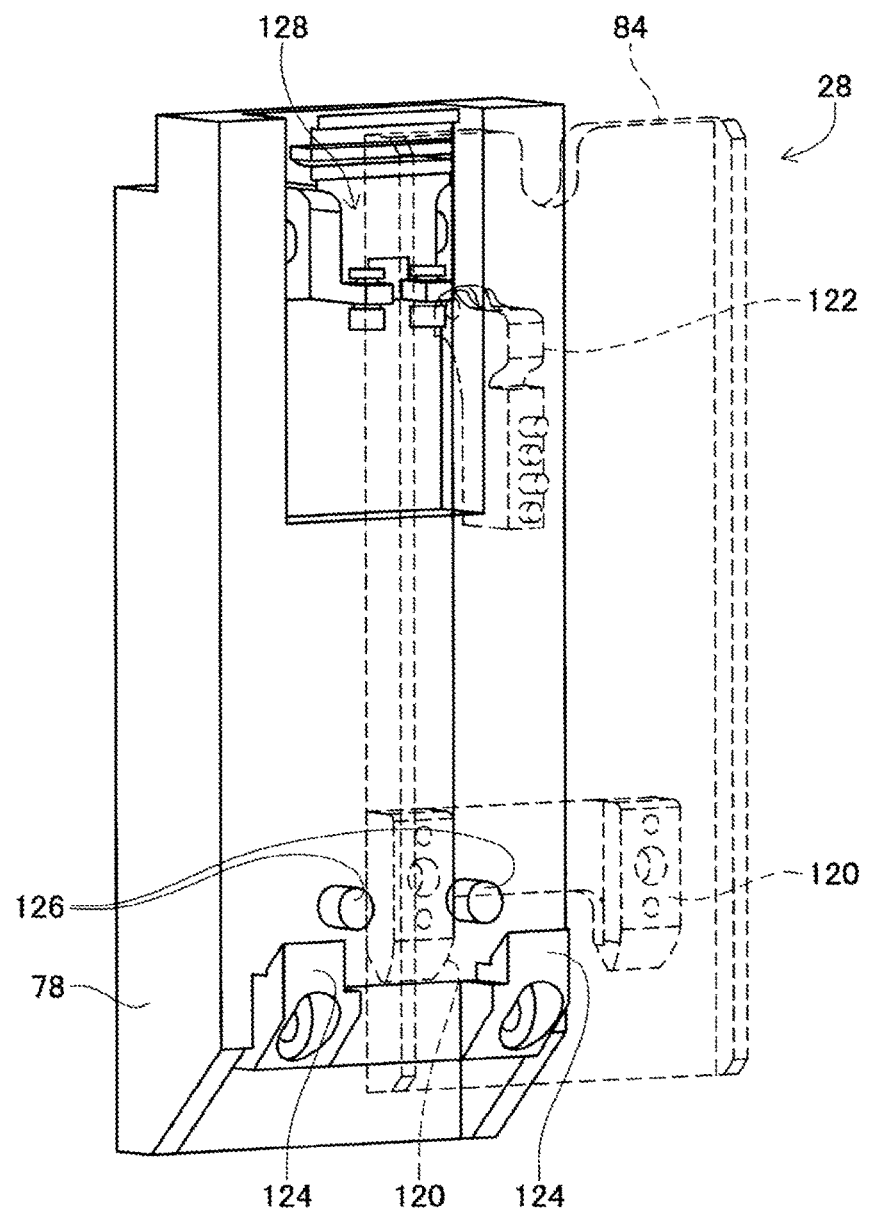
FIG. 8 is a perspective diagram showing a slider and the main body of a support pin gripping device which is detachably mounted on the slider.

Also, main body 84 of support pin gripping device 28 is capable of being attached/detached to/from slider 78 with a single touch. In detail, as shown in FIG. 8, two feet 120 are provided on the lower section of the rear surface of main body 84, and engaging block 122 is provided on the upper section of main body 84. On the other hand, two foot supporting sections 124 and two engaging rollers 126 are provided on the lower section of slider 78, and lock mechanism 128 is provided on the upper section of slider 78. The lower end of foot 120 is wedge-shaped so as to engage with the upper end of foot supporting section 124 which is V-shaped. By this, the vertical position of main body 84, that is, support pin gripping device 28, is decided. Also, by feet 120 engaging with foot supporting sections 124, the outer surface of the two rollers 126 contacts the inner side surface of the two feet 120. By this, the position in the left/right direction of support pin gripping device 28 is decided. Further, in a state with feet 120 engaged with foot supporting sections 124, by pushing engaging block 122 towards lock mechanism 128, engaging block 122 is locked by lock mechanism 128. By this, support pin gripping device 28 is mounted on slider 78 with a single touch. Note that, by operating a release lever (not shown), the locking of engaging block 122 by lock mechanism 128 is released. By this, support pin gripping device 28 is removed from slider 78 with a single touch.

Figure 9:
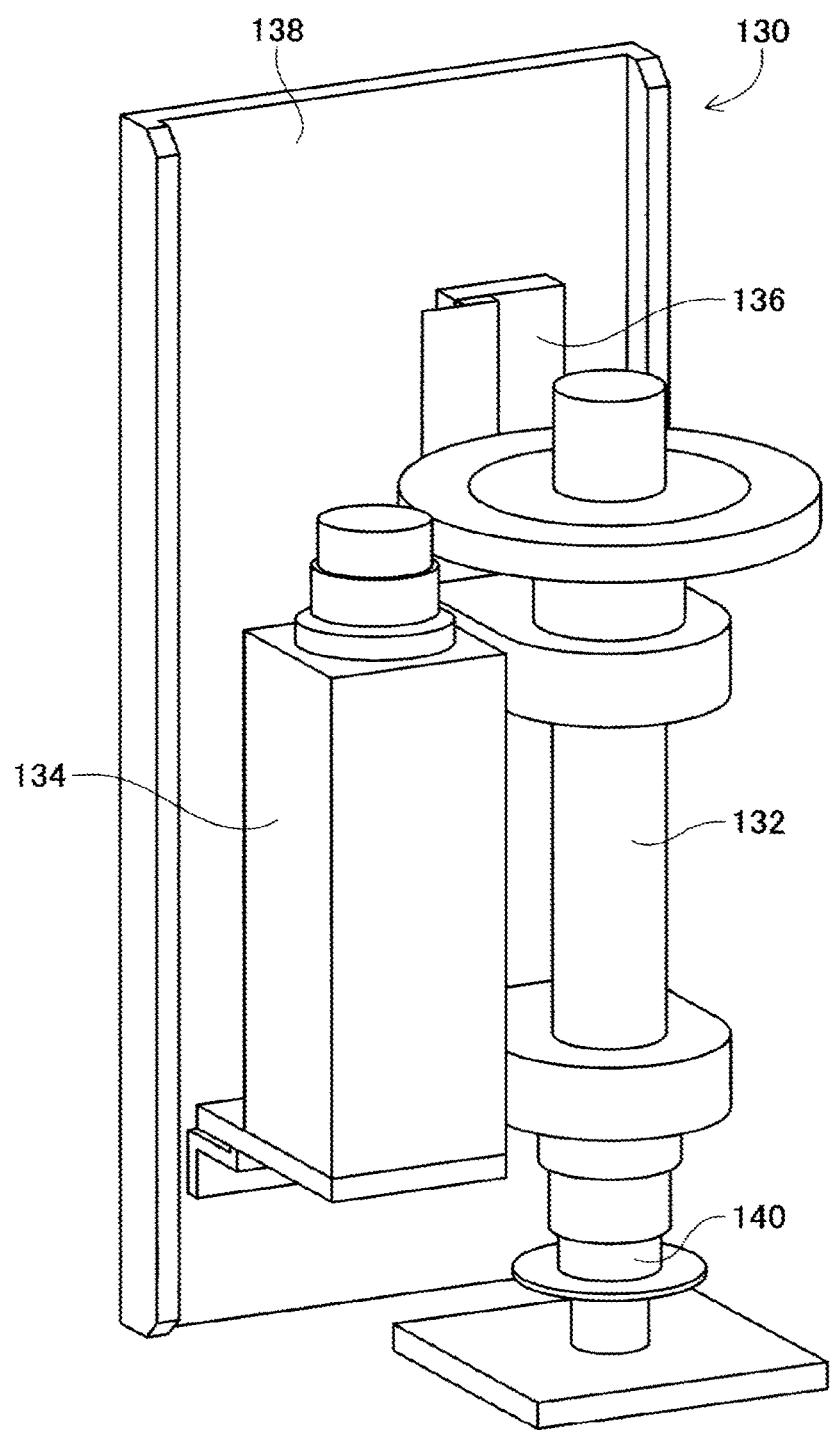
FIG. 9 is a perspective diagram showing an electronic component pickup/holding device detachably mounted on the slider instead of the support pin gripping device.

By removing support pin gripping device 28 from slider 78, various devices can be mounted on slider 78. Specifically, it is possible to mount an electronic component pickup/holding device, a viscous fluid dispensing device, or the like, on slider 78 instead of support pin gripping device 28. As shown in FIG. 9, electronic component pickup/holding device 130 is configured from pickup rod 132, rotating mechanism 134, slide mechanism 136, and main body 138. Suction nozzle 140 is attached to the lower end of pickup rod 132, and suction nozzle 140 picks up and holds, or releases, an electronic component using respectively negative pressure and positive pressure supplied from a positive/negative pressure supply device. Note that, suction nozzle 140 is a nozzle with a relatively large diameter which can thus hold relatively large electronic components. Rotating mechanism 134 rotates pickup rod 132 about its own central axis. Slide mechanism 136 holds pickup rod 132 and rotating mechanism 134 so as to be slidable in the vertical direction, with the vertical position of pickup rod 132 and rotating mechanism 134 being changed by the driving of an electromagnetic motor (not shown). Main body 138 has the same structure as main body 84 of support pin gripping device 28, and is capable of being attached/detached to/from slider 78 with a single touch.

Figure 10:
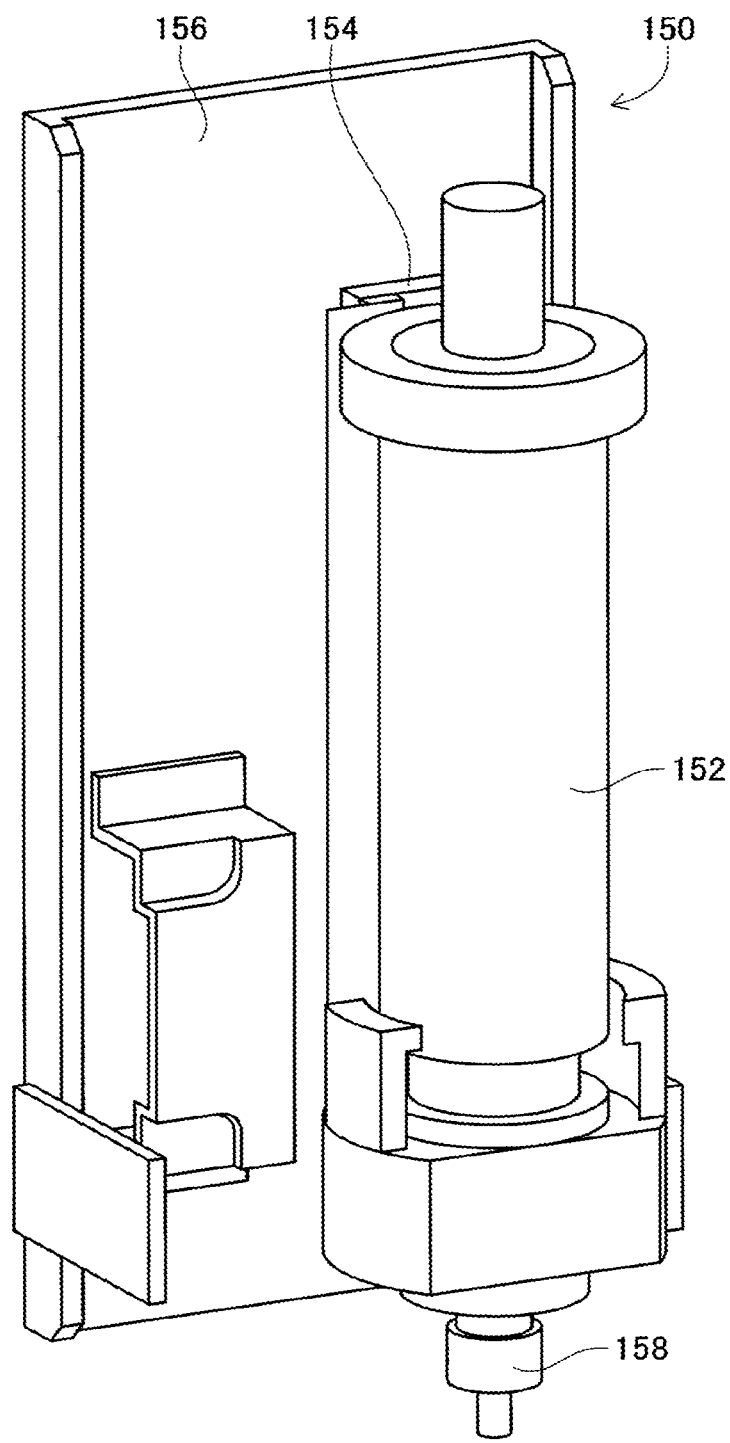
FIG. 10 is a perspective diagram showing a viscous fluid dispensing device detachably mounted on the slider instead of the support pin gripping device.

Also, as shown in FIG. 10, viscous fluid dispensing device 150 is configured from syringe 152, slide mechanism, and main body 156. Dispensing nozzle 158 is attached to a lower end of syringe 152, and dispensing nozzle 158 dispenses a viscous fluid stored inside syringe 152 by the supply of positive pressure from the positive/negative pressure supply device. Slide mechanism 154 holds syringe 152 so as to be slidable in the vertical direction, with the vertical position of syringe 152 being changed by the driving of an electromagnetic motor (not shown). Main body 136 has the same structure as main body 84 of support pin gripping device 28, and is capable of being attached/detached to/from slider 78 with a single touch.

By mounting electronic component pickup/holding device 130, or viscous fluid dispensing device 150 of the above structure on slider 78 instead of support pin gripping device 28, various work with respect to a circuit board becomes possible, thus improving the usability of board work device 10.

<Changing the Arrangement Position of and Exchanging Support Pins Using the Support Pin Gripping Device>

With board work device 10, when the shape of the circuit board which is the work target changes, the arrangement position of support pins 38 is changed by support pin gripping device 28. Specifically, according to instructions of a control device (not shown) of board work device 10, support pin gripping device 28 moves above support pin 38 fixed on pin supporting member 40 by magnetic force, and grips support pin 38 using holding tool 80. Continuing, according to instructions of the control device, support pin gripping device 28 moves above pin supporting member 40 where a support pin 38 is not fixed, and mounts the gripped support pin 38 on pin supporting member 40. By repeating this series of operations, support pins 38 are moved to locations corresponding to the shape of the circuit board which is the work target. Note that, after arranging support pins 38 on pin supporting member 40, support pins 38 are imaged by a camera (not shown) that images board marks on circuit board 34, thus allowing the arrangement position of support pins 38 to be checked. Further, in a case in which the actual arrangement position differs from the planned arrangement position, correction of the arrangement position can be performed based on the image data.

Also, in cases in which many electronic components have been mounted on the surface of the circuit board which is the work target which is supported by support pins 38 (hereinafter sometimes referred to as "pin support surface"), exchange of support pins 38 is performed. In detail, because circuit boards are usually supported by hard support pins 38b, hard support pins 38b are fixed to pin supporting member 40. However, in cases in which many electronic components have been mounted on the pin support surface of the circuit board which is the work target, the intervals between pre-mounted components become small, meaning that there is a concern about hard support pins 38b contacting pre-mounted components, thus damaging the pre-mounted components. For this reason, in cases in which many electronic components have been mounted densely on the pin support surface of the circuit board which is the work target, hard support pins 38b mounted on the pin supporting member 40 are exchanged with soft support pins 38a. Note that, soft support pins 38a are stored in support pin storage device 46.

Specifically, according to instructions of a control device, support pin gripping device 28 moves above a hard support pin 38b which is fixed to pin supporting member 40 by magnetic force, and grips the hard support pin 38b using holding tool 80. Continuing, according to instructions of the control device, support pin gripping device 28 moves above support pin storage device 46 and stores the gripped hard support pin 38b in support pin storage device 46. Next, according to instructions of the control device, support pin gripping device 28 moves above a soft support pin 38a stored in support pin storage device 46 and grips the soft support pin 38a using holding tool 80. And, according to instructions of the control device, support pin gripping device 28 moves above a predetermined position on pin supporting member 40 and mounts the gripped soft support pin 38a on pin supporting member 40. By repeating this series of operations, hard support pins 38b mounted on pin supporting member 40 are exchanged with soft support pins 38a.

<Exchanging Component Cases Using the Support Pin Gripping Device>

With board work device 10, when electronic components are replenished by bulk feeder 50, or when electronic components to be supplied by bulk feeder are exchanged, component case 52 is changed by support pin gripping device 28. Specifically, according to instructions of a control device, bulk feeder 50 ejects a component case 52 which has become unnecessary from case transfer window 56. Next, according to instructions of the control device, support pin gripping device 28 moves above case transfer window 56 of bulk feeder 50 and grips component case 52 using holding tool 80. Continuing, according to instructions of the control device, support pin gripping device 28 moves above case transfer window 58 of case supply device 23 and inserts the gripped component case 52 into case transfer window 58. When component case 52 is inserted into case transfer window 58, according to instructions of the control device, case supply device 23 stores the inserted component case 52 internally. Then, case supply device 23 ejects a specified component case 52 from case transfer window 58.

Continuing, according to instructions of the control device, support pin gripping device 28 moves above case transfer window 58 of case supply device 23 and grips component case 52 using holding tool 80. Then, according to instructions of the control device, support pin gripping device 28 moves above case transfer window 56 of bulk feeder 50 and inserts the gripped component case 52 into case transfer window 56. When component case 52 is inserted into case transfer window 56, according to instructions of the control device, bulk feeder 50 stores the inserted component case 52 internally. By this, replenishment of electronic components to bulk feeder 50, or exchange of electronic components supplied by bulk feeder 50, is performed.

Note that, for the above embodiment, board work device 10 is an example of a board work device. Mounting head 24 is an example of a mounting head. Moving device 26 is an example of a moving device. Support pin gripping device 28 is an example of a support pin gripping device. Circuit board 34 is an example of a circuit board. Support pin 38 is an example of a support pin. Pin supporting member 49 is an example of a pin supporting member. Component case 52 is an example of a member which is different from a support pin. Slider 78 is an example of a mounting member. Gripping claw 86 is an example of a gripping claw. Holding body 88 is an example of a holding body. Protruding section 92 is an example of a protruding section. Recess 116 is an example of a recess. Contacting member 118 is an example of a contacting member.

Further, the present disclosure is not limited to the above example embodiment, and various changed or improved methods of embodiment are possible based on the knowledge of someone skilled in the art. Specifically, for example, in the above embodiment, component case 52 is used as a member which is different from support pin 38 and which is capable of being gripped by holding tool 80, but various members may be used. However, it is necessary for a recess into which protruding section 92 of gripping claw 86 is capable of fitting to be formed in the member.

Also, in the above embodiment, a positive/negative pressure supply device is used as the drive source of gripping claws 86 of holding tool 80, but various driving sources may be used, such as electromagnetic motors, hydraulic actuators, and the like.

Also, in the above embodiment, support pin gripping device 28 is attachable/detachable to/from slider 78 with a single touch using lock mechanism 128, but support pin gripping device 28 may be attachable/detachable to/from slider 78 with a single touch using various mechanisms. Note that, the function of being attachable/detachable with a single touch is a function whereby support pin gripping device is attached to, or detached from, slider 78 without using tools or the like and with good repeatability. However, the attachment/detachment of support pin gripping device 28 to/from slider 78 may be performed using tools or the like. In other words, support pin gripping device 28 may be mounted on slider 78 using bolts or the like.

REFERENCE SIGNS LIST

10: board work device; 24: mounting head (work head); 26: moving device; 28: support pin gripping device; 34: circuit board; 38: support pin; 40: pin supporting member; 52: component case; 78: slider (mounting member); 86: gripping claw (gripping member); 88: holding body; 92: protruding section; 116: recess; 118: contacting member

The invention claimed is:
1. A board work machine comprising:
a work head that performs work with respect to a circuit board;
a mounting member on which the work head is mounted;
a moving device that moves the mounting member to any position; and
a support pin gripping device that grips a support pin, which supports a circuit board, in order to attach the support pin to a pin support member,
wherein the work head is mounted on a first side of the mounting member, the first side of the mounting member extending vertically,
wherein the support pin gripping device is mounted on a second side of the mounting member opposite to the first side of the mounting member on which the work head is mounted, the second side of the mounting member extending vertically, and
wherein the support pin gripping device includes:
first and second gripping members, each of the first and second gripping members including a protrusion section formed on an end thereof, the protrusion sections facing each other, and
a holding body that holds the first and second gripping members such that the protrusion sections of the first and second gripping members are moved closer to each other or further apart from each other.
2. The board work machine according to claim 1, wherein the support pin gripping device grips the support pin by the protrusion sections of the first and second gripping members moving closer to each other, and
a recess is formed in each of the protrusion sections of the first and second gripping members.
3. The board work device according to claim 2, wherein the support pin gripping device includes a contacting member provided on a lower end of the holding body.
4. The board work device according to claim 3, wherein the contacting member does not contact the support pin which is gripped by the support pin gripping device.
5. The board work device according to claim 1, wherein the support pin gripping device is detachably mounted on the mounting member.
6. The board work device according to claim 1, wherein the mounting head is detachably mounted on the mounting member.

* * * * *